United States Patent
Guo et al.

(10) Patent No.: US 9,293,339 B1
(45) Date of Patent: Mar. 22, 2016

(54) METHOD OF POLISHING SEMICONDUCTOR SUBSTRATE

(71) Applicant: Rohm and Haas Electronic Materials CMP Holdings, Inc., Newark, DE (US)

(72) Inventors: Yi Guo, Newark, DE (US); David Mosley, Lafayette Hill, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 14/863,548

(22) Filed: Sep. 24, 2015

(51) Int. Cl.
*H01L 21/302* (2006.01)
*H01L 21/461* (2006.01)
*H01L 21/306* (2006.01)
*H01L 21/3105* (2006.01)

(52) U.S. Cl.
CPC .... *H01L 21/30625* (2013.01); *H01L 21/31055* (2013.01)

(58) Field of Classification Search
CPC .................................................. H01L 21/30625
USPC ............................................. 216/89; 438/693
See application file for complete search history.

(56) References Cited

U.S. PATENT DOCUMENTS

| | | | |
|---|---|---|---|
| 3,007,878 A | | 11/1961 | Alexander et al. |
| 4,959,113 A | * | 9/1990 | Roberts .................... C23F 3/00 216/100 |
| 5,382,272 A | | 1/1995 | Cook et al. |
| 2003/0157804 A1 | | 8/2003 | Puppe et al. |

* cited by examiner

*Primary Examiner* — Roberts Culbert
(74) *Attorney, Agent, or Firm* — Thomas S. Deibert

(57) ABSTRACT

A process for chemical mechanical polishing of a substrate having an exposed silicon dioxide feature is provided comprising: providing a chemical mechanical polishing composition, containing, as initial components: water, a colloidal silica abrasive and a zirconyl compound; wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate; wherein the substrate is polished.

10 Claims, No Drawings

METHOD OF POLISHING SEMICONDUCTOR SUBSTRATE

The present invention relates to the field of chemical mechanical polishing. In particular, the present invention is directed to a process for chemical mechanical polishing of a substrate having an exposed silicon dioxide feature is provided comprising: providing a chemical mechanical polishing composition, containing, as initial components: water, a colloidal silica abrasive and a zirconyl compound; wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate; wherein the substrate is polished.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes nonplanar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

A composition and method for polishing metal features is disclosed by Puppe et al. Specifically, in U.S. Patent Application Publication No. 20030157804, Puppe et al. disclose a composition containing 2.5 to 75% by volume of a 30% by weight cationically modified silica sol, the cationically modified $SiO_2$ particles of which have a mean particle size of 12 to 300 nm, and 0.5 to 22% by weight of at least one oxidizing agent, with pH of 2.5 to 6.

Notwithstanding, there exists a continued need for improved methods of chemical mechanical polishing of substrates having an exposed silicon dioxide feature.

The present invention provides a method of polishing a substrate, comprising: providing the substrate, wherein the substrate has an silicon dioxide feature; providing a chemical mechanical polishing composition, comprising, as initial components: water, 0.01 to 40 wt % of a colloidal silica abrasive, a zirconyl compound and 0 wt % of an oxidizer; wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the exposed silicon dioxide feature is removed from the substrate.

The present invention provides a method of polishing a substrate, comprising: providing the substrate, wherein the substrate has an exposed silicon dioxide feature; providing a chemical mechanical polishing composition, consisting of, as initial components: water, 0.01 to 40 wt % of a colloidal silica abrasive, a zirconyl compound and 0 wt % of an oxidizer; wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the exposed silicon dioxide feature is removed from the substrate.

DETAILED DESCRIPTION

The method of polishing a substrate of the present invention uses a chemical mechanical polishing composition containing a silicon oxide abrasive in combination with a zirconyl compound, wherein the chemical mechanical polishing composition surprisingly has a silicon dioxide removal rate that is significantly (preferably, >500%) higher than the removal rate exhibited by an otherwise identical composition not containing the zirconyl compound.

Preferably, in the method of polishing a substrate of the present invention, comprises: providing the substrate, wherein the substrate has an exposed silicon dioxide feature; providing a chemical mechanical polishing composition, comprising, as initial components: water; 0.01 to 40 wt % (more preferably 0.1 to 25 wt %, still more preferably 1 to 15 wt %, most preferably 3 to 7 wt %) of a colloidal silica abrasive; a zirconyl compound (preferably, wherein the zirconyl compound is selected from the group consisting of zirconyl halide, zirconyl nitrate and zirconyl acetate; more preferably, wherein the zirconyl compound is a zirconyl halide; most preferably, wherein the zirconyl compound is zirconyl chloride); and, 0 wt % of an oxidizer; wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the exposed silicon dioxide feature is removed from the substrate.

Preferably, in the method of polishing a substrate of the present invention, the substrate provided has an exposed silicon dioxide feature. More preferably, the substrate provided is a semiconductor substrate having an exposed silicon dioxide feature. Most preferably, the substrate provided is a semiconductor substrate having an exposed silicon dioxide feature derived from a tetraethalorthosilicate (TEOS).

Preferably, in the method of polishing a substrate of the present invention, the water contained in the chemical mechanical polishing composition provided is at least one of deionized and distilled to limit incidental impurities.

Preferably, in the method of polishing a substrate of the present invention, the colloidal silica abrasive contained in the chemical mechanical polishing composition provided has an average particle size ≤100 nm (preferably, 5 to 100 nm; more preferably, 10 to 60 nm; most preferably, 20 to 60 nm) as measured by dynamic light scattering techniques. Preferably, wherein the colloidal silica abrasive contained in the chemical mechanical polishing composition has a negative native surface charge at the pH of the chemical mechanical polishing composition when measured in water in the absence of the zirconyl compound. Preferably, the colloidal silica contained in the chemical mechanical polishing composition is silicon dioxide based and is aluminum free. Preferably, the colloidal silica contained in the chemical mechanical polishing composition is not an aluminum silicate.

Preferably, in the method of polishing a substrate of the present invention, the chemical mechanical polishing composition provided contains 0.01 to 40 wt % (more preferably 0.1 to 25 wt %, still more preferably 1 to 15 wt %, most preferably 3 to 7 wt %) of a colloidal silica abrasive.

Preferably, in the method of polishing a substrate of the present invention, the chemical mechanical polishing composition provided contains 0.1 to 5 parts per hundred abrasive (PPHA) (preferably, 0.25 to 2 PPHA; more preferably, 0.5 to 1.5 PPHA; most preferably, 0.75 to 1.1 PPHA) of a zirconyl compound, wherein the zirconyl compound is selected from the group consisting of zirconyl halide, zirconyl nitrate and zirconyl acetate. More preferably, in the method of polishing a substrate of the present invention, the chemical mechanical polishing composition provided contains 0.1 to 5 parts per hundred abrasive (PPHA) (preferably, 0.25 to 2 PPHA; more preferably, 0.5 to 1.5 PPHA; most preferably, 0.75 to 1.1 PPHA) of a zirconyl compound, wherein the zirconyl compound is a zirconyl halide. Most preferably, in the method of polishing a substrate of the present invention, the chemical mechanical polishing composition provided contains 0.1 to 5 parts per hundred abrasive (PPHA) (preferably, 0.25 to 2 PPHA; more preferably, 0.5 to 1.5 PPHA; most preferably, 0.75 to 1.1 PPHA) of a zirconyl compound, wherein the zirconyl compound is zirconyl chloride.

Preferably, in the method of polishing a substrate of the present invention, the chemical mechanical polishing composition provided contains 0.1 to 5 wt % (on a solids basis) of a zirconyl compound. More preferably, in the method of polishing a substrate of the present invention, the chemical mechanical polishing composition provided contains 0.5 to 2 wt % (on a solids basis) of a zirconyl compound. Most preferably, in the method of polishing a substrate of the present invention, the chemical mechanical polishing composition provided contains 0.75 to 1.1 wt % (on a solids basis) of a zirconyl compound.

Preferably, in the method of polishing a substrate of the present invention, the chemical mechanical polishing composition provided contains, as initial components: water; 0.01 to 40 wt % (more preferably 0.1 to 25 wt %, still more preferably 1 to 15 wt %, most preferably 3 to 7 wt %) of a colloidal silica abrasive; and 0.1 to 5 parts per hundred abrasive (PPHA) of a zirconyl compound (preferably, wherein the zirconyl compound is selected from the group consisting of zirconyl halide, zirconyl nitrate and zirconyl acetate; more preferably, wherein the zirconyl compound is zirconyl halide; most preferably, wherein the zirconyl compound is zirconyl chloride); wherein the colloidal silica abrasive and the zirconyl compound interact in the water to convert a native negative surface charge on the colloidal silica abrasive to a positive surface charge. More preferably, in the method of polishing a substrate of the present invention, the chemical mechanical polishing composition provided contains, as initial components: water, 0.01 to 40 wt % (more preferably 0.1 to 25 wt %, still more preferably 1 to 15 wt %, most preferably 3 to 7 wt %) of a colloidal silica abrasive; and 0.1 to 5 parts per hundred abrasive (PPHA) of a zirconyl compound (preferably, wherein the zirconyl compound is selected from the group consisting of zirconyl halide, zirconyl nitrate and zirconyl acetate; more preferably, wherein the zirconyl compound is zirconyl halide; most preferably, wherein the zirconyl compound is zirconyl chloride); wherein the colloidal silica abrasive and the zirconyl compound interact in the water to convert a native negative surface charge on the colloidal silica abrasive to a positive surface charge; wherein the chemical mechanical polishing composition has a zeta potential of ≥25 mV and wherein the chemical mechanical polishing composition has a pH of ≤6. Still more preferably, in the method of polishing a substrate of the present invention, the chemical mechanical polishing composition provided contains, as initial components: water, 0.01 to 40 wt % (more preferably 0.1 to 25 wt %, still more preferably 1 to 15 wt %, most preferably 3 to 7 wt %) of a colloidal silica abrasive; and 0.1 to 5 parts per hundred abrasive (PPHA) of a zirconyl compound (preferably, wherein the zirconyl compound is selected from the group consisting of zirconyl halide, zirconyl nitrate and zirconyl acetate; more preferably, wherein the zirconyl compound is zirconyl halide; most preferably, wherein the zirconyl compound is zirconyl chloride); wherein the colloidal silica abrasive and the zirconyl compound interact in the water to convert a native negative surface charge on the colloidal silica abrasive to a positive surface charge; wherein the chemical mechanical polishing composition has a zeta potential of ≥30 mV and wherein the chemical mechanical polishing composition has a pH of ≤5.

Preferably, in the method of polishing a substrate of the present invention, the chemical mechanical polishing composition is oxidizer free (i.e., contains O wt % oxidizer).

Preferably, in the method of polishing a substrate of the present invention, the chemical mechanical polishing composition is corrosion inhibitor free.

Preferably, in the method of polishing a substrate of the present invention, the chemical mechanical polishing composition provided has a pH of ≤6. More preferably, in the method of polishing a substrate of the present invention, the chemical mechanical polishing composition provided has a pH of 3 to 5. Still more preferably, in the method of polishing a substrate of the present invention, the chemical mechanical polishing composition provided has a pH adjusted to 3 to 5 by adding a titrant (preferably, an inorganic acid). Most preferably, in the method of polishing a substrate of the present invention, the chemical mechanical polishing composition provided has a pH adjusted to 3 to 5 by adding hydrochloric acid, HCl.

Preferably, in the method of polishing a substrate of the present invention, the chemical mechanical polishing pad provided can by any suitable polishing pad known in the art. One of ordinary skill in the art will know to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to surface of the substrate being polished.

Preferably, in the method of polishing a substrate of the present invention, the chemical mechanical polishing composition provided has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

Preferably, in the method of polishing a substrate of the present invention, wherein the substrate has an exposed silicon dioxide feature; the chemical mechanical polishing composition provided has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

Some embodiments of the present invention will now be described in detail in the following Examples.

Comparative Examples ZC1-ZC2 and Examples Z1-9

The chemical mechanical polishing compositions of Comparative Examples ZC1-ZC2 and Examples Z1-Z9 were prepared by combining the components in the amounts listed in Table 1 with the balance being deionized water and adjusting the pH of the compositions to the final pH listed in Table 1 with hydrochloric acid. The zeta potential of the chemical mechanical polishing compositions were then measured using a Zetasizer from Malvern. The measured zeta potentials are provided in Table 1.

TABLE 1

| Ex # | Abrasive I* (wt %) | Abrasive II** (wt %) | $ZrOCl_2$ (wt %) | $ZrOCl_2$ (PHA)*** | pH | ZP (mV) |
|---|---|---|---|---|---|---|
| ZC1 | 6 | — | — | — | 3.5 | −15.7 |
| ZC2 | — | 4 | — | — | 5 | −21.2 |
| Z1 | 6 | — | 0.010 | 0.17 | 3.22 | −6.6 |
| Z2 | 6 | — | 0.050 | 0.83 | 2.7 | 23.8 |
| Z3 | 6 | — | 0.100 | 1.67 | 2.46 | 35.8 |
| Z4 | 6 | — | 0.200 | 3.33 | 2.24 | 43.2 |
| Z5 | — | 4 | 0.005 | 0.13 | 4.42 | −7.3 |
| Z6 | — | 4 | 0.010 | 0.25 | 3.43 | 15.5 |
| Z7 | — | 4 | 0.050 | 1.25 | 2.75 | 36.2 |
| Z8 | — | 4 | 0.100 | 2.50 | 2.59 | 40.4 |
| Z9 | — | 4 | 0.200 | 5.00 | 2.3 | 52.3 |

*Abrasive I—Klebosol ™ II 1598-B25 slurry manufactured by AZ Electronic Materials, available from The Dow Chemical Company.
**Abrasive II—Quartron ® PL-3 Ultra High Purity Colloidal Silica available from Fuso Chemical Co., Ltd.
***Parts of $ZrOCl_2$ added per 100 parts of Abrasive I or Abrasive II present in the chemical mechanical polishing composition.

Comparative Examples C1-C3 and Examples 1-10

Chemical Mechanical Polishing Composition Preparation

The chemical mechanical polishing compositions of Comparative Examples C1-C3 and Examples 1-10 were prepared by combining the components in the amounts listed in Table 2 with the balance being deionized water and adjusting the pH of the compositions to the final pH listed in Table 2 with hydrochloric acid.

TABLE 2

| Ex # | Abrasive I* (wt %) | Abrasive II** (wt %) | $ZrOCl_2$ (wt %) | $ZrOCl_2$ (PPHA)*** | pH |
|---|---|---|---|---|---|
| C1 | 6 | — | — | — | 4.0 |
| C2 | — | 4 | — | — | 4.0 |
| C3 | — | 2 | — | — | 4.0 |
| 1 | 6 | — | 0.025 | 0.025 | 4.0 |
| 2 | 6 | — | 0.050 | 0.050 | 4.0 |
| 3 | 6 | — | 0.100 | 0.100 | 4.0 |
| 4 | 6 | — | 0.050 | 0.050 | 5.0 |
| 5 | — | 4 | 0.010 | 0.025 | 4.0 |
| 6 | — | 4 | 0.025 | 0.005 | 4.0 |
| 7 | — | 4 | 0.050 | 0.0025 | 4.0 |
| 8 | — | 2 | 0.005 | 0.00125 | 4.0 |
| 9 | — | 2 | 0.125 | 0.000875 | 4.0 |
| 10 | — | 2 | 0.025 | 0.0005 | 4.0 |

*Abrasive I--Klebosol ™ II 1598-B25 slurry manufactured by AZ Electronic Materials, available from The Dow Chemical Company.
**Abrasive II--Quartron ® PL-3 Ultra High Purity Colloidal Silica available from Fuso Chemical Co., Ltd.
***Parts of $ZrOCl_2$ added per 100 parts of Abrasive I or Abrasive II present in the chemical mechanical polishing composition.

Comparative Examples PC1-PC3 and Examples P1-P10

Chemical Mechanical Polishing Removal Rate Experiments

Silicon dioxide removal rate polishing tests were performed in Comparative Examples PC1-PC3 and Examples P1-P10 using the chemical mechanical polishing compositions prepared according to Comparative Examples C1-C3 and Examples 1-10, respectively. The polishing removal rate experiments were performed on 200 mm blanket wafers installed on an Applied Materials 200 mm Mirra® polishing machine. All polishing experiments were performed using an IC1000™ polyurethane polishing pad (commercially available from Rohm and Haas Electronic Materials CMP Inc.) with a down force of 20.7 kPa (3 psi), a chemical mechanical polishing composition flow rate of 200 mL/min, a table rotation speed of 93 rpm and a carrier rotation speed of 87 rpm. A Saesol® AM02BSL8031-C1 diamond pad conditioner (commercially available from Saesol Diamond Ind. Co. Ltd.) was used to condition the polishing pad. The polishing pad was broken in with the conditioner using a down force of 9 lbs (4.08 kg) for 30 minutes. The polishing pad was further conditioned ex situ prior to polishing using a down force of 7 lbs (3.18 kg) for 10 minutes. The polishing pad was further conditioned in situ during polishing at 10 sweeps/min from 1.7 to 9.2 in from the center of the polishing pad with a down force of 7 lbs (3.18 kg). The removal rates were determined by measuring the film thickness before and after polishing using a KLA-Tencor FX200 metrology tool using a 49 point spiral scan with a 3 mm edge exclusion. The results of the removal rate experiments are provided in TABLE 3.

TABLE 3

| Ex # | Slurry Composition | $SiO_2$ (Å/min) |
|---|---|---|
| PC1 | Comparative Ex. C1 | 179 |
| PC2 | Comparative Ex. C2 | 92 |
| PC3 | Comparative Ex. C3 | 68 |
| P1 | Ex. 1 | 312 |
| P2 | Ex. 2 | 1362 |
| P3 | Ex. 3 | 1490 |
| P4 | Ex. 4 | 554 |
| P5 | Ex. 5 | 359 |
| P6 | Ex. 6 | 1376 |
| P7 | Ex. 7 | 1202 |
| P8 | Ex. 8 | 690 |
| P9 | Ex. 9 | 1219 |
| P10 | Ex. 10 | 1054 |

We claim:

1. A method of polishing a substrate, comprising:
providing the substrate, wherein the substrate has an exposed silicon dioxide feature;
providing a chemical mechanical polishing composition, comprising, as initial components:
water,
0.01 to 40 wt % of a colloidal silica abrasive;
a zirconyl compound; and,
0 wt % of an oxidizer;
wherein a pH of the chemical mechanical polishing composition is ≤6;
providing a chemical mechanical polishing pad with a polishing surface;
dispensing the chemical mechanical polishing composition onto the polishing surface of the chemical mechanical polishing pad in proximity to an interface between the chemical mechanical polishing pad and the substrate; and,
creating dynamic contact at the interface between the chemical mechanical polishing pad and the substrate with a down force of 0.69 to 34.5 kPa;
wherein the substrate is polished; wherein some of the exposed silicon dioxide feature is removed from the substrate.

2. The method of claim 1, wherein the exposed silicon dioxide feature is derived from a tetraethylorthosilicate.

3. The method of claim 2, wherein the chemical mechanical polishing composition is corrosion inhibitor free.

4. The method of claim 2; wherein the chemical mechanical polishing composition has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

5. The method of claim 3; wherein the chemical mechanical polishing composition has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

6. The method of claim 1, wherein the chemical mechanical polishing composition provided, consists of, as initial components:
the water,
0.1 to 40 wt % of the colloidal silica abrasive;
the zirconyl compound; and,
an inorganic acid.

7. The method of claim 6, wherein the exposed silicon dioxide feature is derived from a tetraethylorthosilicate.

8. The method of claim 7; wherein the chemical mechanical polishing composition has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

9. The method of claim 6, wherein the zirconyl compound is zirconyl chloride and wherein the inorganic acid is hydrochloric acid.

10. The method of claim 9, wherein the exposed silicon dioxide feature is derived from a tetraethylorthosilicate; and, wherein the chemical mechanical polishing composition has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

* * * * *